United States Patent
Kim et al.

(10) Patent No.: US 8,580,408 B2
(45) Date of Patent: Nov. 12, 2013

(54) APPARATUS FOR MOVING MAGNETIC DOMAIN WALL AND MEMORY DEVICE INCLUDING MAGNETIC FIELD APPLICATION UNIT

(75) Inventors: Yong-su Kim, Seoul (KR); Sung-chul Lee, Osan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 983 days.

(21) Appl. No.: 11/946,333

(22) Filed: Nov. 28, 2007

(65) Prior Publication Data

US 2008/0124578 A1   May 29, 2008

(30) Foreign Application Priority Data

Nov. 28, 2006 (KR) .................. 10-2006-0118561

(51) Int. Cl.
*G11C 19/00* (2006.01)
(52) U.S. Cl.
USPC ............... 428/800; 365/80; 365/81; 365/171; 365/189.12; 257/241
(58) Field of Classification Search
None
See application file for complete search history.

(56) References Cited

U.S. PATENT DOCUMENTS

| | | | | |
|---|---|---|---|---|
| 3,369,225 A * | 2/1968 | Fuller | | 365/87 |
| 7,710,757 B2 * | 5/2010 | Kim et al. | | 365/81 |
| 7,817,461 B2 * | 10/2010 | Lee et al. | | 365/158 |
| 7,876,595 B2 * | 1/2011 | Xi et al. | | 365/80 |
| 7,961,491 B2 * | 6/2011 | Lee et al. | | 365/81 |
| 8,115,238 B2 * | 2/2012 | Lim et al. | | 257/241 |
| 2005/0079282 A1 | 4/2005 | Jin | | |
| 2005/0094427 A1 * | 5/2005 | Parkin | | 365/80 |
| 2006/0028866 A1 * | 2/2006 | Parkin | | 365/173 |
| 2006/0120132 A1 * | 6/2006 | Parkin | | 365/80 |
| 2006/0238191 A1 * | 10/2006 | Saito | | 324/252 |
| 2008/0068881 A1 * | 3/2008 | Lim et al. | | 365/173 |
| 2008/0080234 A1 * | 4/2008 | Iwata et al. | | 365/171 |
| 2008/0094760 A1 * | 4/2008 | Lee et al. | | 360/324.11 |
| 2008/0138661 A1 * | 6/2008 | Lim et al. | | 428/827 |
| 2009/0273421 A1 * | 11/2009 | Cros et al. | | 335/302 |

FOREIGN PATENT DOCUMENTS

| | | |
|---|---|---|
| JP | 2005-123617 | 5/2005 |
| KR | 10-2004-0108684 | 12/2004 |

* cited by examiner

*Primary Examiner* — Kevin Bernatz
(74) *Attorney, Agent, or Firm* — Harness, Dickey & Pierce, P.L.C.

(57) ABSTRACT

An apparatus for moving a magnetic domain wall and a memory device using a magnetic field application unit are provided. The apparatus for moving a magnetic domain wall includes a magnetic layer having a plurality of magnetic domains; current supply units that are disposed on both sides of the magnetic layer and supply current to the magnetic layer; and a magnetic field application unit that is disposed on at least one surface of the magnetic layer and applies a magnetic field to the magnetic layer.

13 Claims, 3 Drawing Sheets

APPARATUS FOR MOVING MAGNETIC DOMAIN WALL AND MEMORY DEVICE INCLUDING MAGNETIC FIELD APPLICATION UNIT

CROSS-REFERENCE TO RELATED PATENT APPLICATION

This application claims priority from Korean Patent Application No. 10-2006-0118561, filed on Nov. 28, 2006, in the Korean Intellectual Property Office, the disclosure of which is incorporated herein in its entirety by reference.

BACKGROUND OF THE INVENTION

1. Field of the Invention

Apparatuses consistent with the present invention relate to moving a magnetic domain wall using a magnetic field application unit, and more particularly, to moving a magnetic domain wall by supplying current and applying a magnetic field at the same time in order to facilitate the motion of a magnetic domain wall in a magnetic layer.

2. Description of the Related Art

The unit of a magnetic region constituting a magnetic body is typically referred to as a magnetic domain. The directions of magnetic moments due to spins of electrons are the same in a single magnetic domain. The size and magnetic polarization of the magnetic domain may be appropriately controlled by the shape and size of a magnetic material and external energy applied thereto.

A magnetic domain wall is a boundary region between two magnetic domains. The magnetic domain wall can be moved by an externally applied magnetic field or current. A plurality of magnetic domains having specific magnetization directions may be generated in a magnetic layer with a predetermined width and thickness. Also, the magnetic domains and the magnetic domain wall therebetween may be moved by a magnetic field having an appropriate intensity or current.

The principle of magnetic domain wall motion may be applied to a data memory device. For example, when magnetic domains are allowed to pass through a predetermined read/write head using the principle of magnetic domain wall motion, the data memory device is capable of reading/writing data without rotating a recording medium. Since a data memory device using magnetic domain wall motion is structurally simple and has a small size, it is expected that the data memory device using magnetic domain wall motion can have a high recording density of 1 Tbit/in$^2$ or higher.

However, the data memory device using magnetic domain wall motion is still in an initial developmental stage, and several problems need to be solved to put the data memory device using magnetic domain wall motion to practical use. For example, a high current density required for moving a magnetic domain wall is problematic. Thus, power consumption may increase and the motion of the magnetic domain wall may be impeded. The foregoing related art data memory device using magnetic domain wall motion has following problems.

First, when the related art data memory device using magnetic domain wall motion uses only current, a large current is required because data is written or read by pushing or pulling the magnetic domain wall. In comparison, when the related art data memory device using magnetic domain wall motion uses only a magnetic field, the data memory device needs a very complicated structure, so that increasing data density becomes difficult.

Second, when the critical current density required for moving a magnetic domain is high, a driver circuit of a memory chip should drive a large amount of current so that the data memory device needs a large area. Because the data memory device is characteristic of moving the magnetic domain at high speed, the supply of current should be allowed or cut off at a high frequency. In this case, however, the driver circuit of the memory chip should include a large driver transistor and the memory chip should consume more power to increase the supply of current at high speed. As a result, the reliability of the driver circuit may deteriorate.

Third, even if the foregoing configuration of the driver circuit is enabled, when a large current is supplied to the memory device, a large amount of Joule's heat is emitted, which raises the temperature of a memory cell so that the memory cell may perform unstable operations unlike at low temperatures. In other words, the memory device may lose written data due to its poor thermal stability.

Fourth, when the related art memory device uses only a magnetic field, the memory device is readily capable of moving one bit of data. However, when the memory devices moves several bits of data at the same time, a magnetization having the same direction as the magnetic field increases, while a magnetization having an opposite direction to the magnetic field decreases, so that the memory device may lose data. Therefore, it is difficult to perform precise operations, and the efficiency of the memory device is degraded when a magnetic field is applied to the memory device in a direction vertical to the magnetized polarization of the magnetic domain.

Fifth, when a magnetic field is applied to all memory cells, all the memory cells operate at the same time. Therefore, each of the memory cells should include a magnetic field application structure in order to make only a desired cell perform an operation. Accordingly, the entire structure becomes complicated to drive the respective memory cells. Thus, the related art memory device using magnetic domain wall motion cannot have high density like in a conventional magnetic random access memory (MRAM).

SUMMARY OF THE INVENTION

The present invention provides an apparatus for moving a magnetic domain wall using a magnetic field application unit, which can move a magnetic domain wall of a magnetic layer at a low current density.

Also, the present invention provides a memory device using magnetic domain wall motion, which includes a magnetic field application unit.

According to an aspect of the present invention, there is provided an apparatus for moving a magnetic domain wall. The apparatus includes a magnetic layer having a plurality of magnetic domains; current supply units that are disposed on both sides of the magnetic layer and supplies current to the magnetic layer; and a magnetic field application unit that is disposed on at least one surface of the magnetic layer and applies a magnetic field to the magnetic layer.

The magnetic field application unit may apply a magnetic field of ten to several thousand Oe to the magnetic layer.

The magnetic field application unit may be disposed on both top and bottom surfaces of the magnetic layer.

The magnetic field application unit may be formed of a permanent magnet.

The magnetic field application unit may be formed of a sintered magnet, a rubber magnet, or a plastic magnet.

The magnetic field application unit may be formed of an oxide magnet, such as an AlNiCo magnet or a ferrite magnet, or a rare earth magnet formed of Sm—Co, Nd—Fe—B, or Y—Co.

The magnetic layer may be formed of a high-Ku material.

According to another aspect of the present invention, there is provided a memory device including a magnetic field application unit. The memory device includes a memory element using magnetic domain wall motion, the memory element comprising a magnetic layer having a plurality of magnetic domains and current supply units disposed on both ends of the magnetic layer; and a magnetic field application unit that is disposed on at least one surface of the memory element and applies a magnetic field to the magnetic layer.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS OF THE INVENTION

Figure 1:
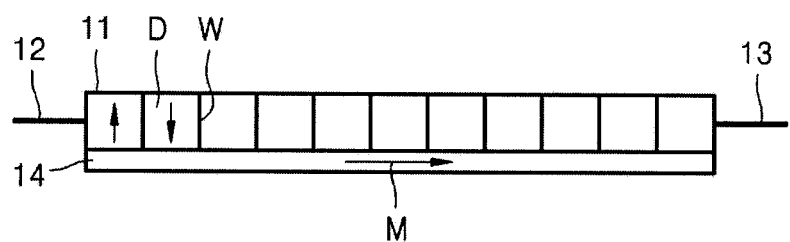
FIG. 1 is a schematic diagram illustrating an apparatus for moving a magnetic domain wall according to an exemplary embodiment of the present invention.

The present invention will now be described more fully hereinafter with reference to the accompanying drawings, in which exemplary embodiments of the invention are shown. In the drawings, the thicknesses of layers and regions are exaggerated for clarity.

FIG. 1 is a schematic diagram illustrating an apparatus for moving a magnetic domain wall according to an exemplary embodiment of the present invention.

Referring to FIG. 1, an apparatus for moving a magnetic domain wall includes a magnetic layer 11 having a plurality of magnetic domains D. Current supply units 12 and 13 are disposed on both ends of the magnetic layer 11 to supply current to the magnetic layer 11. The current supply units 12 and 13 may be electrodes. Also, a magnetic field application unit 14 is disposed on at least one of top and bottom surfaces of the magnetic layer 11 to apply a magnetic field M to the magnetic layer 11.

The magnetic layer 11 is formed of a material having a high magnetic anisotropy energy constant, i.e., a high-Ku material. The magnetic layer 11 may have a magnetic anisotropy energy constant of $10^5$ J/m$^3$ or higher, for example, $10^5$ J/m$^3$ to $10^7$ J/m$^3$. Also, the magnetic layer 11 may have a vertical magnetization characteristic. For example, the magnetic layer 11 may be formed of CoPt, CoPd, FePt, FePd, or an alloy thereof. The current supply units 12 and 13 may be formed of a conductive layer, such as a metal layer or a metal oxide layer. The current supply units 12 and 13 may be connected to a driver transistor (not shown).

The magnetic field application unit 14 is formed of a material that can apply the magnetic field M to the magnetic layer 11 in one direction. Thus, the magnetic field application unit 14 may be formed of a permanent magnet so as to continuously apply the magnetic field M without additional supply of external energy. The permanent magnet is obtained by applying a strong magnetic field to a substance to align the magnetic directions of individual magnetic bodies in the same direction. The magnetic field application unit 14 may be formed of an oxide magnet, such as an AlNiCo magnet or a ferrite magnet, a rare earth sintered magnet formed of Sm—Co, Nd—Fe—B, or Y—Co, a rubber magnet, or a plastic magnet. In addition, the magnet field application unit 14 may be formed of Cr, Co, CuNiFe, Ferrite Vinyl Bonded, or Vicalloy. The intensity of the magnetic field M applied to the magnetic layer 11 by the magnetic field application unit 14 may be controlled by changing the material of the magnetic field application unit 14 or during a magnetizing process in the range of ten to several thousand Oe, e.g., 10 to 3000 Oe.

The direction of the magnetic field M applied to the magnetic layer 11 by the magnetic field application unit 14 may be vertical to the magnetized polarization of the magnetic layer 11. As illustrated in FIG. 1, the magnetic layer 11 may be formed of a material having vertical magnetic anisotropy so that the magnetic layer 11 has a vertical magnetized polarization. In this case, the direction of the magnetic field M applied by the magnetic field application unit 14 may be any one of a right direction and a left direction.

Figure 2A:
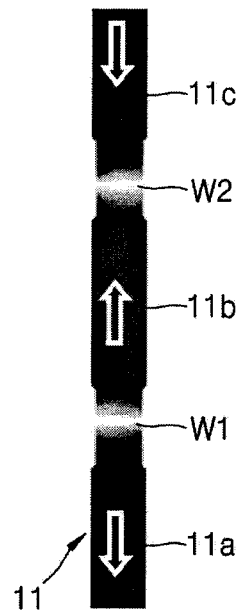
FIGS. 2A and 2B are diagrams showing a magnetic domain wall motion, when a magnetic field is applied in the same direction as or in an opposite direction to the magnetized polarization of a magnetic layer.
Figure 2B:
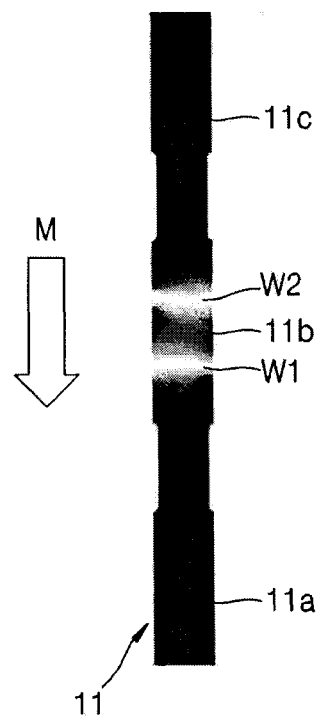

FIGS. 2A and 2B are diagrams showing a magnetic domain wall motion, when a magnetic field is applied in the same direction as or in an opposite direction to the magnetized polarization of a magnetic layer. Specifically, FIG. 2A shows a case where the magnetic field M is not applied to the magnetic layer 11. The magnetic layer 11 includes three magnetic domains 11a, 11b, and 11c, a magnetic domain wall W1 between the magnetic domains 11a and 11b, and a magnetic domain wall W2 between the magnetic domains 11b and 11c. When the magnetic field M is applied to the magnetic layer 11 in the same direction as the magnetized polarization of the magnetic layer 11, the magnetic domain walls W1 and W2 move as illustrated in FIG. 2B. The magnetic domain walls W1 and W2 move in opposite directions according to the magnetized polarization of the magnetic domains 11a, 11b, and 11c. Thus, it can be confirmed that the magnetic domain 11b between the magnetic domain walls W1 and W2 contracts. As a result, the magnetic polarization of the magnetic field application unit 14 of FIG. 1 can be controlled so that the magnetic field M can be applied in a vertical direction to the magnetized polarization of the magnetic layer 11.

As described above, the apparatus for moving a magnetic domain wall according to the exemplary embodiment of the present invention is characterized by applying the magnetic field M in a vertical direction to the magnetized polarization of the magnetic layer 11. When the magnetic field M is applied in the vertical direction to the magnetized polarization of the magnetic layer 11, the energy of the magnetic domain wall is reduced so that the magnitude of a current or magnetic field required for moving the magnetic domain wall can be lessened. Here, the direction vertical to the magnetized polarization of the magnetic layer 11 refers to a plane direction normal to the magnetized polarization of the magnetic layer 11. In this case, the energy of the magnetic domain wall can be reduced by the same ratio no matter which plane direction the magnetic field M is applied in.

Therefore, the energy of the magnetic domain wall can be reduced by the same ratio using the magnetic field application unit 14 irrespective of whether the magnetic layer 11 is magnetized upward or downward, as illustrated in FIG. 1. After the magnetic field M is applied to the magnetic layer 11, when a current is supplied by the current supply units 12 and 13 disposed on both ends of the magnetic layer 11, the magnetic domains D and magnetic domain walls W are moved at a rate that is proportional to the magnitude of the current. While moving the magnetic domains D and the magnetic domain walls W, a distance between the magnetic domain walls W is maintained constant. In this case, a smaller current is required to move the magnetic domains D and the magnetic domain walls D than when the magnetic field M is not applied to the magnetic layer 11.

Figure 3:
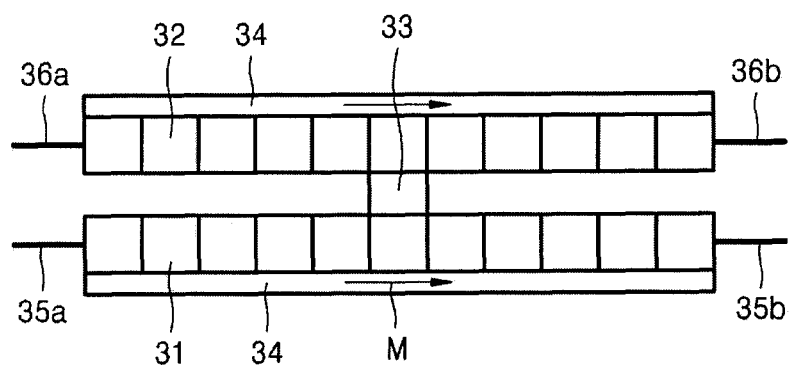
FIG. 3 is a schematic diagram illustrating a memory device using an apparatus for moving a magnetic domain wall according to an exemplary embodiment of the present invention.

FIG. 3 is a schematic diagram illustrating a memory device using an apparatus for moving a magnetic domain wall according to an exemplary embodiment of the present invention.

Referring to FIG. 3, a memory device using an apparatus for moving a magnetic domain wall includes a first magnetic layer 31, a second magnetic layer 32 disposed on the first magnetic layer 31, and a connection layer 33 disposed between the first magnetic layer 31 and the second magnetic layer 32. Electrodes 35a and 35b are disposed on both ends of the first magnetic layer 31 to supply current to the first magnetic layer 31, and electrodes 36a and 36b are disposed on both ends of the second magnetic layer 32 to supply current to the second magnetic layer 32. A magnetic field application unit 34 is disposed on a bottom surface of the first magnetic layer 31 and a top surface of the second magnetic layer 32. The magnetic field application unit 34 may be disposed on at least one of the bottom surface of the first magnetic layer 31 and the top surface of the second magnetic layer 32.

The first magnetic layer 31 and the second magnetic layer 32 are formed of a high-Ku material. The connection layer 33 may be formed of a magnetic material. The electrodes 35a and 35b disposed on both ends of the first magnetic layer 31 and the electrodes 36a and 36b disposed on both ends of the second magnetic layer 32 may be formed of a conductive material. The magnetic field application unit 34 is formed of a permanent magnet in order to apply a constant magnetic field M to the first and second magnetic layers 31 and 32.

A data storage method of the memory device using the an apparatus for moving the a magnetic domain wall shown in FIG. 3 will now be briefly described. It is assumed that the first magnetic layer 31 is a write track, and the second magnetic layer 32 is a storage track. The first magnetic layer 31 includes a magnetic domain whose magnetized polarization is an upward direction and a magnetic domain whose magnetized polarization is a downward direction. A single magnetic domain is defined as a data unit. For example, a magnetic domain that is magnetized upward is defined as data "0," and a magnetic domain that is magnetized downward is defined as a data "1."

For example, a case where a magnetic domain whose magnetized polarization is an upward direction is to be stored on a right end of the second magnetic layer 32 will be described. Initially, a magnetic domain whose magnetized polarization is a downward direction, which is disposed in the first magnetic layer 31, is selected. A current is supplied through the electrodes 35a and 35b disposed on both ends of the first magnetic layer 31 so that the magnetic domain whose magnetized polarization is the downward direction is moved under the connection layer 33. Since the magnetic domain wall is moved in a direction in which electrons flow, the magnetic domain wall is moved in an opposite direction to the direction in which the current is supplied. Thereafter, a current is supplied to the electrode 36b disposed on the right end of the second magnetic layer 32 and one electrode of the first magnetic layer 31. In this case, the current is allowed to flow from the electrode 36b toward the electrode 35a. Thus, the magnetic domain disposed under the connection layer 33 moves from the first magnetic layer 31 through the connection layer 33 toward the right end of the second magnetic layer 32. When reading stored data, the stored data may be moved toward the first magnetic layer 31 and read using a magnetoresistance (MR) device (not shown), such as a giant MR (GMR) device or a tunneling MR (TMR) device disposed on the first magnetic layer 31.

The magnetic field application unit 34 disposed on the bottom surface of the first magnetic layer 31 and the top surface of the second magnetic layer 32 may apply the magnetic field M in a vertical direction to the magnetized polarizations of the first and second magnetic layers 31 and 32. Also, the magnitude of current required for moving the magnetic domains in the first and second magnetic layers 31 and 32 can be lowered using the magnetic field application unit 34.

The structure of the memory device using magnetic domain wall motion as shown in FIG. 3 may be variously changed, and the apparatus for moving a magnetic domain wall according to the exemplary embodiment of the present invention may be structured to apply a magnetic field in a vertical direction to the magnetized polarization of a magnetic layer of a memory device.

Hereinafter, a method of forming an apparatus for moving a magnetic domain wall on a memory device according to an exemplary embodiment of the present invention will be described in detail. Initially, a constant magnetic field should be applied to a magnetic layer in a vertical direction to the magnetized polarization of the magnetic layer. When a magnetic field application unit is formed to generate an induced magnetic field using current, a current should be continually supplied each time a record operation is performed, so that power consumption increases. As a result, the memory device consumes more power.

Therefore, methods for applying a constant magnetic field without supplying current are as follows.

Figure 4:
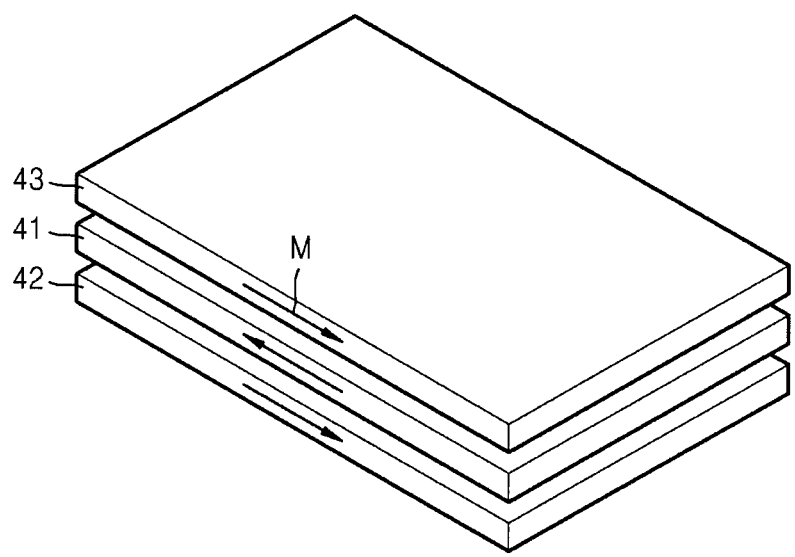
FIG. 4 is a schematic perspective view illustrating a package structure obtained by attaching permanent magnets on both sides of a memory device using magnetic domain wall motion according to an exemplary embodiment of the present invention.

FIG. 4 is a schematic perspective view illustrating a package structure obtained by attaching permanent magnets on both sides of a memory device using magnetic domain wall motion according to an exemplary embodiment of the present invention.

Referring to FIG. 4, when packaging a memory device using magnetic domain wall motion, permanent magnets 42 and 43 are mounted on and under a memory device 41 and molded. In this case, the permanent magnets 42 and 43 may be plastic magnets or rubber magnets to facilitate a molding process. When the magnetized polarization of the permanent magnets 42 and 43 is fixed in a right direction, a magnetic field is induced in a left direction in the memory device 41. By optionally changing the material of the permanent magnets 42 and 43 disposed on both sides of the memory device 41 in the same manner, the intensity of a magnetic field applied by the permanent magnets 42 and 43 may be controlled to be ten to several thousand Oe. As a result, a drive current supplied to the memory device 41 can be reduced in the above-described simple manner.

Alternatively, when fabricating a memory device, a first magnetic layer for forming a permanent magnet is formed during a wafer process, a memory device is formed on the first magnetic layer, and a second magnetic layer for forming a permanent magnet is formed on the memory device. However, this method becomes very complicated because a process of coating each magnetic layer for forming the permanent magnet should be followed by a field annealing process.

Figure 5:
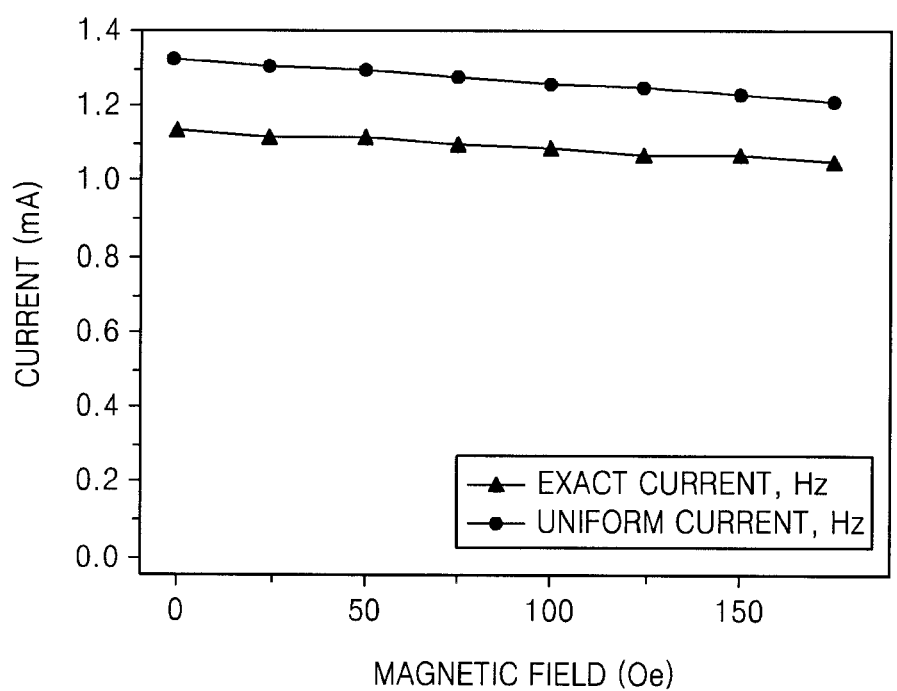
FIG. 5 is a graph of current versus magnetic field, when a current is supplied through both ends of a magnetic layer while varying a magnetic field applied to the magnetic layer to move a magnetic domain wall in the magnetic layer.

FIG. 5 is a graph of current versus magnetic field, when a current is supplied through both ends of a magnetic layer while varying a magnetic field applied to the magnetic layer to move a magnetic domain wall in the magnetic layer.

Referring to FIG. 5, it can be observed that when the magnetic field applied to the magnetic layer varies from 0 Oe to 150 Oe, the magnitude of current required for moving the magnetic domain wall in the magnetic layer gradually decreases.

An apparatus for moving a magnetic domain wall according to an exemplary embodiment of the present invention has the following advantages.

First, the magnitude of current required for moving magnetic domains in a magnetic layer having the magnetic domains can be greatly reduced.

Second, since a memory device using magnetic domain wall motion can be driven at a low current, data can be recorded and reproduced in parallel. Thus, the data can be recorded and reproduced at high speed so as to meet the recent demand for high-speed memory devices.

Third, a magnetic layer may be formed of a high-Ku material having vertical magnetic anisotropy, so that the magnetic layer can be formed of various materials.

Fourth, when the magnetic layer is formed of a material having vertical magnetic anisotropy, the generation of a vortex wall may be suppressed in a magnetic domain. Thus, the thickness of a magnetic domain wall can be reduced, so that a memory device can have small memory size and high recording density.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for moving a magnetic domain wall, the apparatus comprising:
   a magnetic layer having a plurality of magnetic domains and a magnetic domain wall between each pair of adjacent magnetic domains;
   current supply units that are disposed on opposite sides of the magnetic layer and supply current to the magnetic layer; and
   a magnetic field application unit that is disposed on at least one surface of the magnetic layer and applies a magnetic field to the magnetic layer; wherein
      when the magnetic domain walls are moved, the magnetic domain walls are moved in response to the supplied current and the applied magnetic field, and
      the magnetic field of the magnetic field application unit has a direction which is normal to a magnetized polarization of the magnetic layer.

2. The apparatus of claim 1, wherein the magnetic field applied to the magnetic layer has an intensity in a range of 10 to 3000 Oe.

3. The apparatus of claim 1, wherein the magnetic field application unit is disposed on a top surface and a bottom surface of the magnetic layer.

4. The apparatus of claim 1, wherein the magnetic field application unit comprises a permanent magnet.

5. The apparatus of claim 1, wherein the magnetic field application unit comprises one of a sintered magnet, a rubber magnet, and a plastic magnet.

6. The apparatus of claim 1, wherein the magnetic field application unit comprises of one of an oxide magnet and a rare earth magnet, the oxide magnet comprises one of an AlNiCo magnet and a ferrite magnet, and the rare earth magnet is formed of one of Sm—Co, Nd—Fe—B, and Y—Co.

7. The apparatus of claim 1, wherein the magnetic layer is formed of a material having a magnetic anisotropy energy constant greater than or equal to about $10^5$ J/m$^3$.

8. The apparatus of claim 1, wherein the magnetic field of the magnetic field application unit is applied such that energy of magnetic domain walls between the magnetic domains is reduced relative to a case where the magnetic field is not applied.

9. A memory device comprising:
   a memory element using magnetic domain wall motion, the memory element comprising a magnetic layer having a plurality of magnetic domains and a magnetic domain wall between each pair of adjacent magnetic domains, the memory element further including current supply units disposed on opposite ends of the magnetic layer, the current supply units being configured to supply current to the magnetic layer; and
   a magnetic field application unit that is disposed on at least one surface of the memory element and applies a magnetic field to the magnetic layer, wherein
      when the magnetic domain walls are moved, the magnetic domain walls are moved in response to the supplied current and the applied magnetic field, and
      the magnetic field of the magnetic field application unit has a direction which is normal to a magnetized polarization of the magnetic layer.

10. The memory device of claim 9, wherein the magnetic field applied to the magnetic layer has an intensity in a range of 10 to 3000 Oe.

11. The memory device of claim 9, wherein the magnetic field application unit is disposed on a top surface and a bottom surface of the memory element.

12. The memory device of claim 9, wherein the magnetic field application unit comprises a permanent magnet.

13. An information storage device comprising:
   a magnetic layer having a plurality of magnetic domains and a magnetic domain wall between each pair of adjacent magnetic domains; and
   a device configured to move the magnetic domain walls within the magnetic layer by applying a current and a magnetic field to the magnetic layer, wherein
      when the magnetic domain walls are moved, the magnetic domain walls are moved in response to the applied current and the applied magnetic field,
      the device includes,
         current supply units disposed at opposite sides of the magnetic layer and configured to supply the current to the magnetic layer, and
         a magnetic field application unit disposed on at least one surface of the magnetic layer and configured to apply the magnetic field to the magnetic layer, and
      the magnetic field of the magnetic field application unit has a direction which is normal to a magnetized polarization of the magnetic layer.

* * * * *